US009263114B2

(12) United States Patent
Lee et al.

(10) Patent No.: US 9,263,114 B2
(45) Date of Patent: Feb. 16, 2016

(54) ELECTRONIC DEVICE

(71) Applicants: Ji-Wang Lee, Gyeonggi-do (KR);
Dong-Keun Kim, Gyeonggi-do (KR);
Masahiro Takahashi, Tokyo (JP);
Tsuneo Inaba, Tokyo (JP)

(72) Inventors: Ji-Wang Lee, Gyeonggi-do (KR);
Dong-Keun Kim, Gyeonggi-do (KR);
Masahiro Takahashi, Tokyo (JP);
Tsuneo Inaba, Tokyo (JP)

(73) Assignees: SK Hynix Inc., Gyeonggi-do (KR);
KABUSHIKI KAISHA TOSHIBA,
Tokyo (JP)

( * ) Notice: Subject to any disclaimer, the term of this patent is extended or adjusted under 35 U.S.C. 154(b) by 0 days.

(21) Appl. No.: 14/563,690

(22) Filed: Dec. 8, 2014

(65) Prior Publication Data

US 2015/0294705 A1    Oct. 15, 2015

(30) Foreign Application Priority Data

Apr. 10, 2014    (KR) .......................... 10-2014-0043014

(51) Int. Cl.
| | |
|---|---|
| *G11C 11/00* | (2006.01) |
| *G11C 11/16* | (2006.01) |
| *G11C 13/00* | (2006.01) |
| *G11C 11/15* | (2006.01) |
| *G11C 11/56* | (2006.01) |

(52) U.S. Cl.
CPC ............ *G11C 11/1673* (2013.01); *G11C 11/15* (2013.01); *G11C 11/16* (2013.01); *G11C 11/5607* (2013.01); *G11C 11/5657* (2013.01); *G11C 13/004* (2013.01); *G11C 2013/0054* (2013.01)

(58) Field of Classification Search
None
See application file for complete search history.

(56) References Cited

U.S. PATENT DOCUMENTS

| | | | | |
|---|---|---|---|---|
| 7,075,813 | B2 * | 7/2006 | Moriyama | ............... G11C 7/06 365/148 |
| 2009/0323405 | A1 * | 12/2009 | Jung | ................. G11C 11/1673 365/158 |
| 2011/0310657 | A1 | 12/2011 | Kim et al. | |
| 2014/0241040 | A1 * | 8/2014 | Jeong | ................ G11C 11/5607 365/148 |
| 2014/0244945 | A1 * | 8/2014 | Kim | ..................... G11C 13/004 711/147 |

FOREIGN PATENT DOCUMENTS

| | | |
|---|---|---|
| KR | 1020070063801 | 6/2007 |
| KR | 1020120027540 | 3/2012 |

* cited by examiner

*Primary Examiner* — Minh-Loan Tran
(74) *Attorney, Agent, or Firm* — IP & T Group LLP

(57) ABSTRACT

A semiconductor memory unit includes first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element.

20 Claims, 10 Drawing Sheets

ELECTRONIC DEVICE

CROSS-REFERENCE TO RELATED APPLICATIONS

The present application claims priority of Korean Patent Application No. 10-2014-0043014, entitled "ELECTRONIC DEVICE" and filed on Apr. 10, 2014, which is incorporated herein by reference in its entirety.

BACKGROUND

1. Field

This patent document relates to memory circuits or devices and their applications in electronic devices or systems.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory) an MRAM (magnetic random access memory), an E-fuse, etc.

SUMMARY

The disclosed technology in this patent document includes memory circuits or devices and their applications in electronic devices or systems and various implementations of an electronic device in which comparison units for determining the data stored in variable resistance elements share a reference resistor element to decrease the number of reference resistor elements included in a semiconductor device, thereby reducing an area.

In an implementation, there is provided an electronic device including a semiconductor memory unit. The semiconductor memory unit may include: first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element.

The first reference resistance value may be 1/N of the second reference resistance value.

Each of the first to $N^{th}$ variable resistance elements may have a first resistance value smaller than the second reference resistance value when a first value is stored therein, and have a second resistance value greater than the second reference resistance value when a second value is stored therein.

A $K^{th}$ ($1 \leq K \leq N$) comparison unit among the first to $N^{th}$ comparison units may output a result of the determination by comparing an amount of a $K^{th}$ variable current flowing through a $K^{th}$ variable resistance element corresponding to the $K^{th}$ comparison unit and an amount of a $K^{th}$ reference current flowing between the $K^{th}$ comparison unit and the reference resistance element.

A value stored in the $K^{th}$ variable resistance element may be the first value when the amount of the $K^{th}$ variable current is greater than the $K^{th}$ reference current, and a value stored in the $K^{th}$ variable resistance element may be the second value when the amount of the $K^{th}$ variable current is smaller than the $K^{th}$ reference current.

An amount of current flowing through the reference resistance element may be a sum of the amounts of first to $N^{th}$ reference currents flowing between the first to $N^{th}$ comparison units and the reference resistance element, respectively.

Each of the $K^{th}$ comparison unit may include: an output node and an output bar node; a first internal node and a second internal node; a precharge driving section suitable for pull-up driving the output node and the output bar node during a precharge operation; an output bar driving section suitable for driving the output bar node with one of a pull-up voltage or a voltage of the first internal node in response to a voltage of the output node during a read operation; an output driving section suitable for driving the output node with one of the pull-up voltage and a voltage of the second internal node in response to a voltage of the output bar node during the read operation; a first current sinking section suitable for drawing the $K^{th}$ variable current from the first internal node during the read operation; and a second current sinking section suitable for drawing the $K^{th}$ reference current from the second internal node during the read operation.

The output bar driving section may pull-down drive the output bar node, and the output driving section may pull-up drive the output node when the amount of the $K^{th}$ variable current is greater than the $K^{th}$ reference current, and The output bar driving section may pull-up drive the output bar node, and the output driving section may pull-down drive the output node when the amount of the $K^{th}$ variable current is smaller than the $K^{th}$ reference current.

Each of the first to $N^{th}$ variable resistance elements may include at least one of a metal oxide, a phase change substance, and a structure in which a tunnel barrier layer is interposed between two ferromagnetic layers.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In an implementation, there is provided an electronic device including a semiconductor memory unit. The semiconductor memory unit may include: first to $N^{th}$ groups of variable resistance elements, each variable resistance element of which has different resistance values according to values stored therein, wherein N is a natural number equal to or greater than 2; a reference resistance element having a first reference resistance value; and first to $N^{th}$ comparison units which correspond to the first to $N^{th}$ groups of variable resistance elements, respectively, and each of which determines whether a resistance value of one selected among the corresponding group of variable resistance elements is greater or smaller than a second reference resistance value, wherein the first to $N^{th}$ comparison units are commonly coupled to the reference resistance element.

The first reference resistance value may be 1/N of the second reference resistance value.

Each variable resistance element of the first to $N^{th}$ groups of variable resistance elements may have a first resistance value smaller than the second reference resistance value when a first value is stored therein, and have a second resistance value greater than the second reference resistance value when a second value is stored therein.

A $K^{th}$ (1≤K≤N) comparison unit among the first to $N^{th}$ comparison units may output a result of the determination by comparing an amount of a $K^{th}$ variable current flowing through one selected from a $K^{th}$ group of variable resistance elements corresponding to the $K^{th}$ comparison unit and an amount of a $K^{th}$ reference current flowing between the $K^{th}$ comparison unit and the reference resistance element.

A value stored in the one selected from the $K^{th}$ group of variable resistance elements may be the first value when the amount of the $K^{th}$ variable current is greater than the $K^{th}$ reference current, and the value stored the one selected from the $K^{th}$ group of variable resistance elements may be the second value when the amount of the $K^{th}$ variable current is smaller than the $K^{th}$ reference current.

An amount of current flowing through the reference resistance element may be a sum of the amounts of first to $N^{th}$ reference currents flowing between the first to $N^{th}$ comparison units and the reference resistance element, respectively.

Each of the $K^{th}$ comparison unit may include: an output node and an output bar node; a first internal node and a second internal node; a precharge driving section suitable for pull-up driving the output node and the output bar node during a precharge operation; an output bar driving section suitable for driving the output bar node with one of a pull-up voltage or a voltage of the first internal node in response to a voltage of the output node during a read operation; an output driving section suitable for driving the output node with one of the pull-up voltage and a voltage of the second internal node in response to a voltage of the output bar node during the read operation; a first current sinking section suitable for drawing the $K^{th}$ variable current from the first internal node during the read operation; and a second current sinking section suitable for drawing the $K^{th}$ reference current from the second internal node during the read operation.

The output bar driving section may pull-down drive the output bar node and the output driving section may pull-up drive the output node when the amount of the $K^{th}$ variable current is greater than the $K^{th}$ reference current, and the output bar driving section may pull-up drive the output bar node, and the output driving section pull-down may drive the output node when the amount of the $K^{th}$ variable current is smaller than the $K^{th}$ reference current.

Each of the plurality of first to $N^{th}$ variable resistance elements may include at least one of a metal oxide, a phase change substance, and a structure in which a tunnel barrier layer is interposed between two ferromagnetic layers.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In an implementation, there is provided an electronic device including a semiconductor memory unit. The semiconductor memory unit may include: a first variable resistance element with different resistance values according to values stored therein; a second variable resistance element with different resistance values according to values stored therein; a reference resistor element with a first reference resistance value; a first comparison unit having a first input terminal which is connected to the first variable resistance element and a second input terminal which is connected to the reference resistor element, and configured to determine whether a resistance value of the first variable resistance element is larger or smaller than a second reference resistance value; and a second comparison unit having a first input terminal which is connected to the second variable resistance element and a second input terminal which is connected to the reference resistor element, and configured to determine whether a resistance value of the second variable resistance element is larger or smaller than the second reference resistance value.

The first reference resistance value may be ½ of the second reference resistance value.

Each of the first variable resistance element and the second variable resistance element may have a first resistance value smaller than the second reference resistance value when a first value is stored therein, and have a second resistance value larger than the second reference resistance value when a second value is stored therein.

Each of the first comparison unit and the second comparison unit may output a result of comparing an amount of current flowing through the first input terminal thereof and an amount of current flowing through the second input terminal thereof.

In the case where the amount of current flowing through the first input terminal of the first comparison unit is larger than the amount of current flowing through the second input terminal of the first comparison unit, a value stored in the first variable resistance element is the first value, and, in the case where the amount of current flowing through the first input terminal of the first comparison unit is smaller than the amount of current flowing through the second input terminal of the first comparison unit, a value stored in the first variable resistance element is the second value.

In the case where the amount of current flowing through the first input terminal of the second comparison unit is larger than the amount of current flowing through the second input terminal of the second comparison unit, a value stored in the second variable resistance element is the first value, and, in the case where the amount of current flowing through the first input terminal of the second comparison unit is smaller than the amount of current flowing through the second input terminal of the second comparison unit, a value stored in the second variable resistance element is the second value.

An amount of current flowing through the reference resistor element may be equal to a sum of the amount of current flowing through the second input terminal of the first comparison unit and the amount of current flowing through the second input terminal of the second comparison unit.

Each of the first comparison unit and the second comparison unit may include: an output node and an output bar node; a first internal node and a second internal node; a precharge driving section configured to pull-up drive the output node and the output bar node in a precharge operation; an output bar driving section configured to pull-up drive the output bar node in response to a voltage of the output node or drive the output bar node with a voltage of the first internal node, in a read operation; an output driving section configured to pull-up drive the output node in response to a voltage of the output bar node or drive the output node with a voltage of the second internal node, in the read operation; a first current sinking section configured to sink current from the first internal node by an amount of current corresponding to a voltage of the first input terminal in the read operation; and a second current sinking section configured to sink current from the second internal node by an amount of current corresponding to a voltage of the second input terminal in the read operation.

In the case where the amount of current flowing through the first input terminal is larger than the amount of current flowing through the second input terminal, the output bar driving section pull-down drives the output bar node, and the output driving section pull-up drives the output node.

In the case where the amount of current flowing through the second input terminal is larger than the amount of current flowing through the first input terminal, the output bar driving section pull-up drives the output bar node, and the output driving section pull-down drives the output node.

Each of the first variable resistance element and the second variable resistance element may include at least one of a metal oxide, a phase change substance, and a structure in which a tunnel barrier layer is interposed between two ferromagnetic layers.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

DETAILED DESCRIPTION

Various examples and implementations of the disclosed technology are described below in detail with reference to the accompanying drawings.

A semiconductor device in accordance with implementations of the present disclosure may include a variable resistance element. In the following descriptions, a variable resistance element may exhibits a resistance variable characteristic and may include a single layer or a multi-layer. For example, a variable resistance element may include substances used in an RRAM, a PRAM, an MRAM, an FRAM, etc., for example, a chalcogenide-based compound, a transition metal compound, a ferroelectric, a ferromagnetic, and so on. However, the present invention is not limited to these substances, and it is sufficient for a variable resistance element to have a resistance variable characteristic that it is switched between different resistant states according to voltages or current applied to both ends thereof.

In detail, a variable resistance element may include a metal oxide. For example, the metal oxide may be a transition metal oxide such as a nickel (Ni) oxide a titanium (Ti) oxide, a hafnium (Hf) oxide, a zirconium (Zr) oxide, a tungsten (W) oxide and a cobalt (Co) oxide or a perovskite-based substance such as STO (SrTiO) and PCMO (PrCaMnO). Such a variable resistance element may exhibit a characteristic that it is switched between different resistant states due to creation and extinction of current filaments through behavior of vacancies.

Also, a variable resistance element may include a phase change substance. For example, the phase change substance may be a chalcogenide-based substance such as GST (Ge—Sb—Te). This variable resistance element may exhibit a characteristic that it is switched between different resistant states by being stabilized in a crystalline state and an amorphous state by heat.

Further, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The variable resistance element may exhibit a characteristic that it is switched between different resistant states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistant state.

Figure 1:
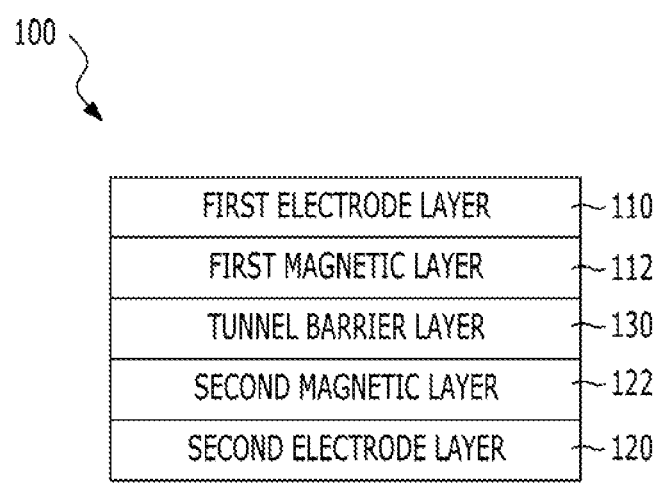
FIG. 1 shows an exemplary configuration diagram of a magnetic tunnel junction (MTJ) element as one of the structures in which a tunneling barrier layer is interposed between two ferromagnetic layers.

FIG. 1 shows a diagram showing an exemplary configuration diagram of a magnetic tunnel junction (MTJ) element 100 as one of structures in which a tunneling barrier layer is interposed between two ferromagnetic layers.

Referring to FIG. 1, the MTJ element 100 may include a first electrode layer as a top electrode, a second electrode layer as a bottom electrode, a first ferromagnetic layer and a second ferromagnetic layer as a pair of ferromagnetic layers, and a tunneling barrier layer which is formed between the pair of ferromagnetic layers.

The first ferromagnetic layer may be a free ferromagnetic layer, the magnetization direction of which is changed according to a direction of current applied to the MTJ element 100, and the second ferromagnetic layer may be a pinned ferromagnetic layer, the magnetization direction of which is pinned.

A resistance value of the MTJ element 100 may be changed according to a direction of current, and the MJT element 100 may record data "0" or "1".

Figure 2A:
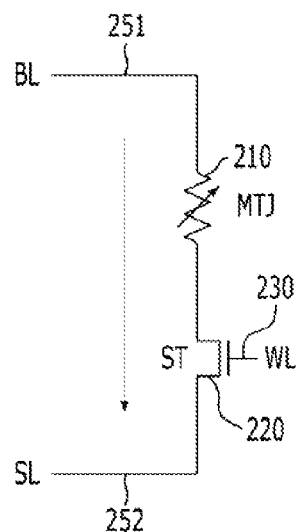
FIGS. 2A and 2B show a principle of storing data in a variable resistance element.
Figure 2B:
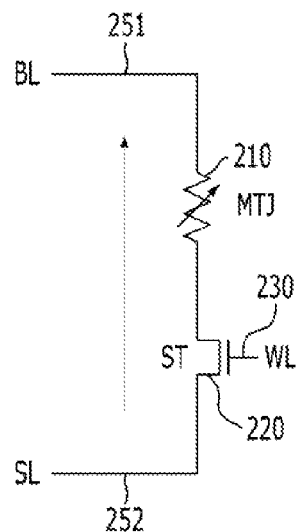

FIGS. 2A and 2B show a principle of storing data in a variable resistance element R. The variable resistance element R may be the MTJ element 100 described above with reference to FIG. 1.

FIG. 2A shows a principle of storing data having a low logic value in the variable resistance element R. In order to select the variable resistance element R in which data is to be stored, a word line WL connected to the variable resistance element R may be activated, and a select transistor ST may be turned on. As current flows from one end to the other end (in the direction indicated by the arrow), that is, from the first electrode layer as a top electrode to the second electrode layer as a bottom electrode in the MTJ element 100 shown in FIG. 1, the magnetization direction of the first ferromagnetic layer as a free ferromagnetic layer and the magnetization direction of the second ferromagnetic layer as a pinned ferromagnetic layer may become parallel to each other, and the variable resistance element R may be in a low resistance state. When the variable resistance element R is in the low resistance state, it is defined that 'low' data is stored in the variable resistance element R.

FIG. 2B is a diagram explaining a principle of storing data having a high logic value in the variable resistance element R. In a similar manner as described with reference to FIG. 2A, the word line WL connected to the variable resistance element R may be activated, and the select transistor ST may be turned on. As current flows from one end to the other end (in the direction indicated by the arrow), that is, from the second electrode layer to the first electrode layer in the MTJ element 100 shown in FIG. 1, the magnetization direction of the first ferromagnetic layer and the magnetization direction of the second ferromagnetic layer may become anti-parallel to each other, and the variable resistance element R may be n a high resistance state. When the variable resistance element R is in the high resistance state, it is defined that 'high' data is stored in the variable resistance element R.

Figure 3:
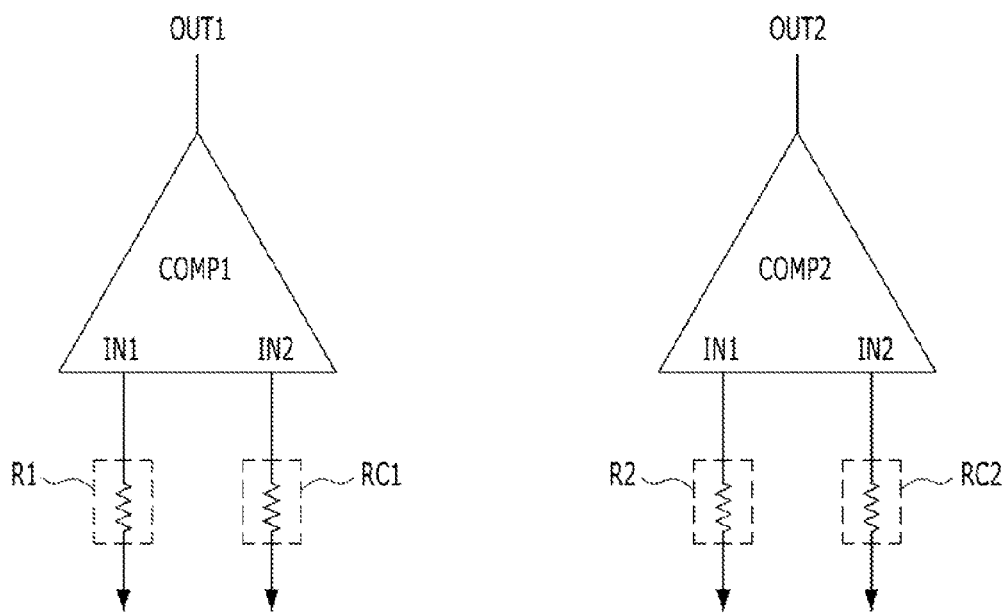
FIG. 3 shows an exemplary configuration diagram of a memory circuit (device) including variable resistance elements.

FIG. 3 shows an exemplary configuration diagram of a memory circuit (device) including variable resistance elements.

As shown in FIG. 3, the memory circuit (device) may include the first variable resistance element R1, a first reference resistance element RC1, a first comparison unit COMP1, the second variable resistance element R2, a second reference resistance element RC2, and a second comparison unit COMP2. The memory circuit (device) including variable resistance elements may read the data stored in variable resistance elements R1 and R2. Although the memory circuit (device) includes a number of variable resistance elements which are disposed in the form of an array, FIG. 3 shows the above-described configuration as an example for the sake of clear explanation.

Each of the first variable resistance element R1 and the second variable resistance element R2 may have a first resistance value RL when the low data is stored therein, and a second resistance value RH greater than the first resistance value RL when the high data is stored therein. Each of the first reference resistance element RC1 and the second reference resistance element RC2 may have a resistance value between the first resistance value RL and the second resistance value RH.

In a read operation, when the first variable resistance element R1 is designated by an address, the first comparison unit COMP1 may compare the resistance value of the first variable resistance element. R1 connected to a first input node IN1 and the resistance value of the first reference resistance element RC1 connected to a second input node IN2, and may output a comparison result through an output node OUT1. According to the value outputted from the output node OUT1, the data stored in the first variable resistance element R1 is determined. For example, in the case where the resistance value of the first variable resistance element R1 is smaller than the resistance value of the first reference resistance element RC1 as a result of the comparison of the first comparison unit COMP1, it is determined that the low data is stored in the first variable resistance element R1, and, in the case where the resistance value of the first variable resistance element R1 is greater than the resistance value of the first reference resistance element RC1 as a result of the comparison of the first comparison unit COMP1, it is determined that the high data is stored in the first variable resistance element R1. When the second variable resistance element R2 is designated by an address, in a similar manner as described above, the second comparison unit COMP2 may compare the resistance value of the second variable resistance element R2 connected to a first input node IN1 and the resistance value of the second reference resistance element RC2 connected to a second input node 1N2, and may output a comparison result through an output node OUT2. According to the value outputted from the output node OUT2, the data stored in the second variable resistance element R2 is determined.

In general, a semiconductor device includes several tens to several thousands of comparison units as described above. Since each comparison unit should be necessarily connected with a reference resistance element to determine the data stored in a variable resistance element, the semiconductor device includes reference resistance elements equal to the number of comparison units. Because each reference resistance element includes a resistive component, as a semiconductor device becomes highly integrated and the number of comparison units increases, the number of resistive elements also increases, which consumes more area.

Figure 4:
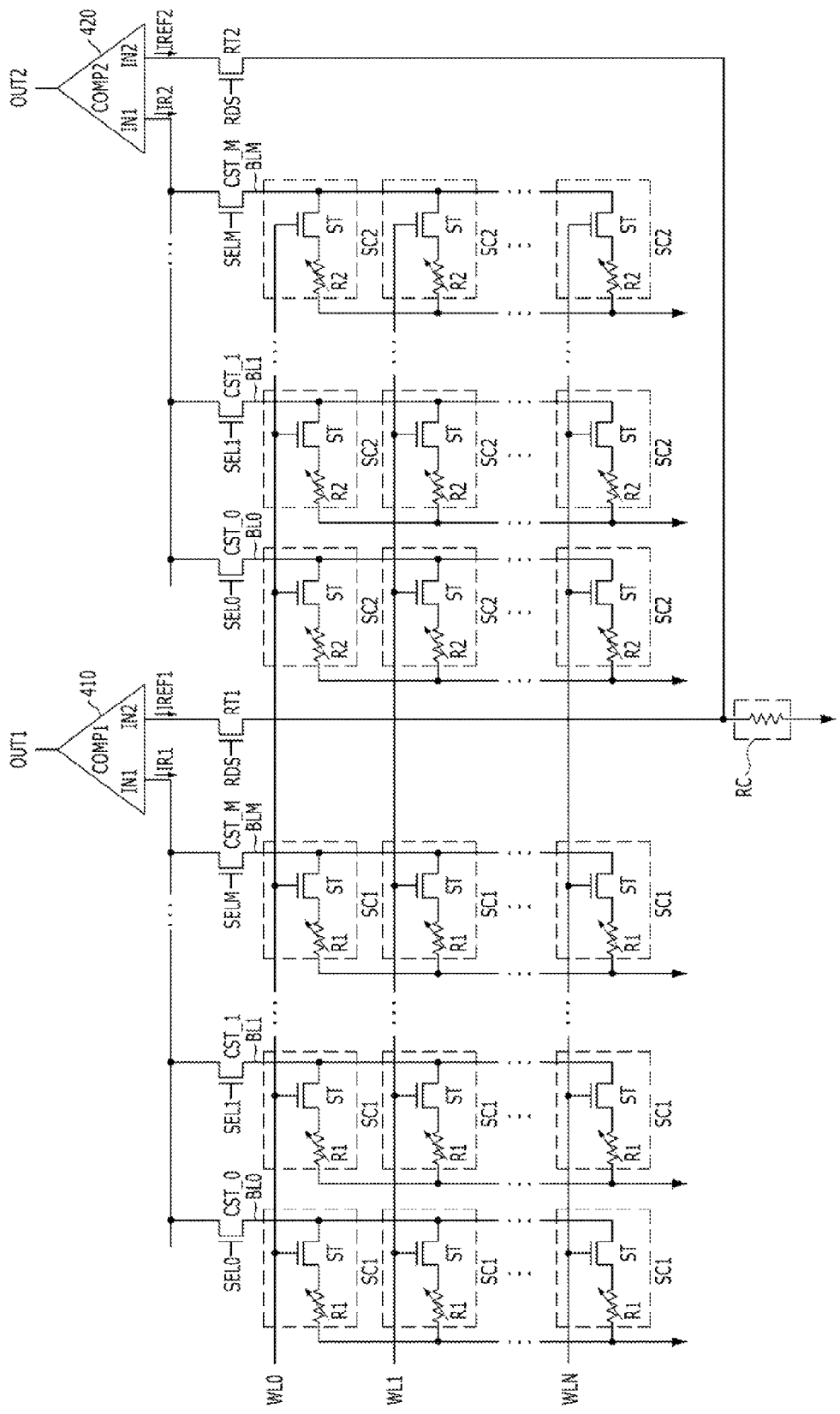
FIG. 4 shows an exemplary configuration diagram of a memory circuit (device) including variable resistance elements.
Figure 6:
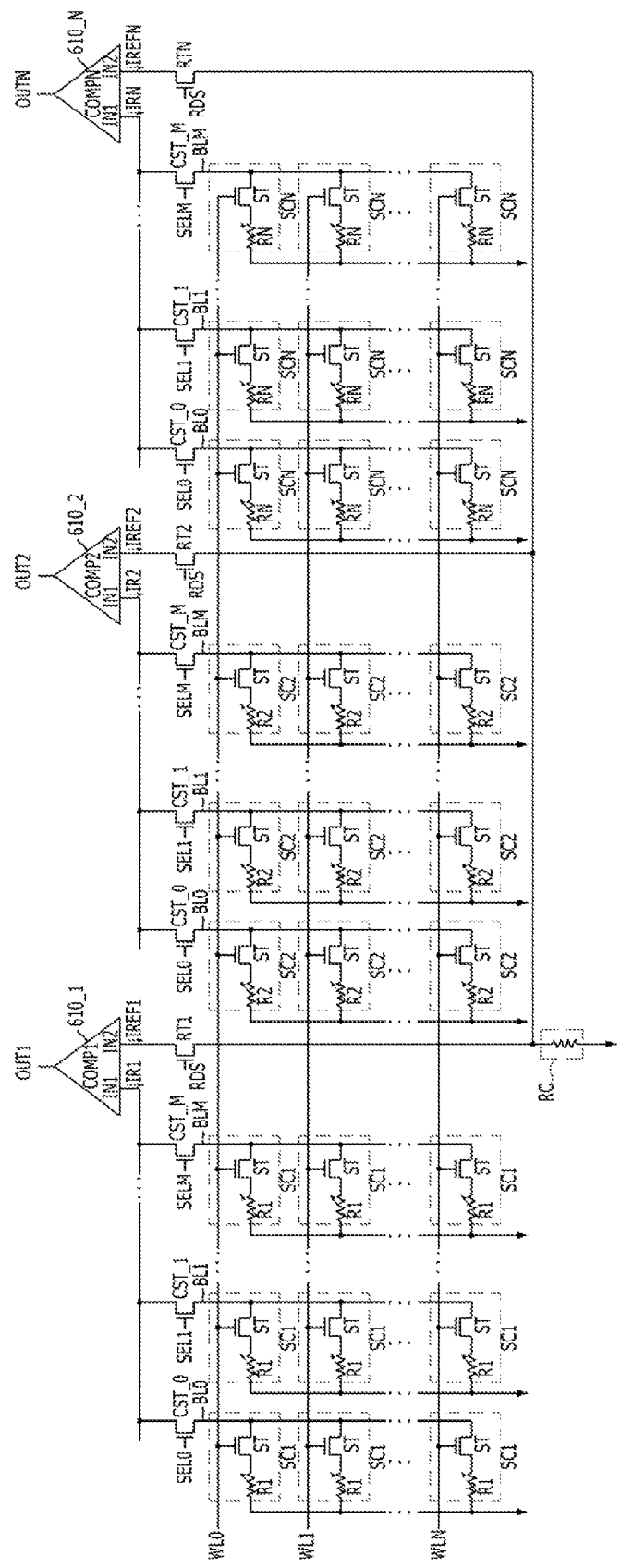
FIG. 6 shows an exemplary configuration diagram of a memory circuit (device) including variable resistance elements.

FIGS. 4 and 6 show implementations of a memory circuit (device) including variable resistance elements as described above.

FIG. 4 shows an exemplary configuration diagram of a memory circuit (device) including variable resistance elements.

As shown in FIG. 4, the memory circuit (device) may include a plurality of first variable resistance elements R1 each having different resistance values according to the values stored therein, a plurality of second variable resistance elements R2 each having different resistance values according to the values stored therein, a reference resistance element RC having a first reference resistance value, a first comparison unit 410 having a first input node IN1 which is connected to one end of a first variable resistance element R1 selected among the plurality of first variable resistance elements R1 and a second input node IN2 which is connected to one end of the reference resistance element RC, and may determine whether the resistance value of the selected first variable resistance element R1 is greater or smaller than a second reference resistance value RREF, and a second comparison unit 420 having a first input node IN1 which is connected to one end of a second variable resistance element R2 selected among the plurality of second variable resistance elements R2 and a second input node IN2 which is connected to the one end of the reference resistance element. RC, and may determine whether the resistance value of the selected second variable resistance element R2 is greater or smaller than the second reference resistance value RREF. The first reference resistance value of the reference resistance element RC may be a half of the second reference resistance value RREF, which will be described later.

The memory circuit (device) may further include select transistors ST which are connected with the variable resistance elements R1 and R2 to allow current to flow through the variable resistance elements R1 and R2 when the resistance values of the variable resistance elements R1 and R2 change. Each select transistor ST may be turned on when a word line connected thereto is activated, and turned off when the word line connected thereto is deactivated. Hereinafter, each first variable resistance element R1 and each select transistor ST will be collectively referred to as a first storage cell SC1, and each second variable resistance element R2 and each select transistor ST will be collectively referred to as a second storage cell SC2.

The memory circuit (device) will be described in detail with reference to FIG. 4.

The memory circuit (device) may include the variable resistance elements R1 and R2 for storing data, and the reference resistance element RC used for determining the values stored in the variable resistance elements R1 and R2. Each of the variable resistance elements R1 and R2 may be in the low resistance state (with the first resistance value RL) when the low data (first data) is stored therein. Conversely, each of the variable resistance elements R1 and R2 may become in the high resistance state (with the second resistance value RH) when the high data (second data) is stored therein. The values stored in the variable resistance elements R1 and R2 or the states of the variable resistance elements R1 and R2 may vary according to high data and low data stored in the variable resistance elements R1 and R2.

The first comparison unit 410 may output a result of comparing the resistance value of a first variable resistance element R1 selected among the plurality of first variable resistance elements R1 and the second reference resistance value RREF. The second reference resistance value RREF may be greater than the first resistance value RL and smaller than the second resistance value RH. That is to say, each of the variable resistance elements R1 and R2 has the first resistance value RL smaller than the second reference resistance value RREF when a first value (a low value) is stored therein, and has the second resistance value RH greater than the second reference resistance value RREF when a second value (a high value) is stored therein. Accordingly, each of the variable resistance elements R1 and R2 may be determined to store the low data when the resistance value of each of the variable resistance elements R1 and R2 is smaller than the second reference resistance value RREF, and may be determined to store the high data when the resistance value of each of the selected first variable resistance elements R1 and R2 is greater than the second reference resistance value RREF.

The plurality of first storage cells SC1 electrically coupled to the first comparison unit 410 may be disposed in the form of an array. Each of the plurality of first storage cells SC1 may correspond to a single word line among a plurality of word lines WL0 to WLN, and a single bit line among a plurality of bit lines BL0 to BLM. In order to select a single first storage cell SC1 among the plurality of first storage cells SC1, the memory circuit may activate a single word line among the plurality of word lines WL0 to WLN, and electrically connect a single bit line among the plurality of bit lines BL0 to BLM to the first input node IN1 of the first comparison unit 410. The selected first storage cell SC1 may correspond to the address (not shown) inputted to the memory circuit. A plurality of column select transistors CST_0 to CST_M may correspond to the plurality of bit lines BL0 to BLM, respectively. Each of a plurality of column select transistors CST_0 to CST_M may be connected between the corresponding bit line among the plurality of bit lines BL0 to BLM and the first input node IN1 of the first comparison unit 410, and may be turned on when the corresponding column select signal among a plurality of column select signals SEL0 to SELM is activated.

In a read operation, read current IR1 corresponding to the resistance value of the selected first variable resistance element R1 included in the selected first storage cell SC1 may flow through the first input node IN1 of the first comparison unit 410, and reference current IREF1 corresponding to the second reference resistance value RREF may flow through the second input node IN2 of the first comparison unit 410. The read current IR1 may pass through both ends of the selected first variable resistance element R1, and the reference current IREF1 may pass through both ends of the reference resistance element RC. The first comparison unit 410 may determine whether the resistance value of the selected first variable resistance element R1 is greater or smaller than the second reference resistance value RREF by comparing the amount of the read current IR1 and the amount of the reference current IREF1, and may output the result of determination or comparison through an output node OUT1.

The amount of the read current IR1 flowing through the first variable resistance element R1 having the first resistance value RL is greater than the amount of the read current IR1 flowing through the first variable resistance element R1 having the second resistance value RH. The amount of the reference current IREF1 is smaller than the amount of the read current IR1 flowing through the first variable resistance element R1 having the first resistance value RL, and is greater than the amount of the read current IR1 flowing through the first variable resistance element R1 having the second resistance value RH. Accordingly, when the amount of the current IR1 is greater than the amount of the reference current IREF1, the selected first variable resistance element R1 may be determined to store the first value (the low value), and when the amount of the current IR1 is smaller than the amount of the reference current IREF1, the selected first variable resistance element R1 may be determined to store the second value (the high value).

As described above, the reference resistance element RC may have the first reference resistance value which is a half of the second reference resistance value RREF. That is to say, the first reference resistance value may be RREF/2. The reference resistance element RC may be connected to the second input node IN2 of the first comparison unit 410 through a first transistor RT1, and may be connected to the second input node IN2 of the second comparison unit 420 through a second transistor RT2. The first and second transistors RT1 and RT2 may be turned on in response to a read signal RDS which is activated during the read operation. When the first and second transistors RT1 and RT2 are turned on, the reference resistance element RC may be electrically connected with the second input nodes IN2 of the first and second comparison units 410 and 420.

According to the comparison result as described above, when the resistance value of the first variable resistance element R1 is smaller than the second reference resistance value RREF, or when the value of the read current IR1 is greater than the value of the reference current IREF1, the first comparison unit 410 may output the low value stored in the first variable resistance element R1, through the output node OUT1, and, when the resistance value of the first variable resistance element R1 is greater than the second reference resistance value RREF, or when the value of the read current IR1 is smaller than the value of the reference current IREF1, the first comparison unit 410 may output the high value stored in the first variable resistance element R1, through the output node OUT1.

During the read operation, in the same manner as a single first storage cell SC1 is selected among the plurality of first storage cells SC1, a single second storage cell SC2 may be selected among the plurality of second storage cells SC2. While it is illustrated in FIG. 4 that the second storage cells SC2 are connected to the same word lines as the first storage cells SC1 and are selected in response to the same column select signals SEL0 to SELM, it is to be noted that the first storage cells SC1 and the second storage cells SC2 may be connected to different word lines and may be selected by different column select signals.

The second comparison unit 420 may operate in the same manner as the first comparison unit 410 described above. The second comparison unit 420 may determine whether the resistance value of the selected second variable resistance element R2 is greater or smaller than the second reference resistance value RREF by comparing the amount of a read current IR2 flowing though the selected second variable resistance element R2 and the amount of a reference current IREF2 corresponding to the second reference resistance value RREF, and may output the result of determination or comparison through an output node OUT2. The value outputted from the output node OUT2 may correspond to the value stored in the selected second variable resistance element R2.

During the read operation, one of the plurality of first variable resistance elements R1 and one of the plurality of second variable resistance elements R2 are simultaneously selected, and the values stored in the selected first variable resistance element R1 and the selected second variable resistance element R2 are simultaneously read. Therefore, the read current IR1 corresponding to the resistance value of the selected first variable resistance element R1 and the read current IR2 corresponding to the resistance value of the selected second variable resistance element R2 may simultaneously flow through the first input node IN1 of the first comparison unit 410 and the first input node IN1 of the second comparison unit 420, respectively, and reference current IREF1 and reference current IREF2 corresponding to the second reference resistance value RREF may simultaneously flow through the second input node IN2 of the first comparison unit 410 and the second input node IN2 of the second comparison unit 420, respectively. Accordingly, the amount of current flowing through the reference resistance element RC is equal to the sum of the amount of current IREF1 and IRFE2 respectively flowing through the second input node IN2 of the first comparison unit 410 and the second input node IN2 of the second comparison unit 420.

Unlike the conventional art, in the present disclosure, the two comparison units 410 and 420 may share the reference resistance element RC, and therefore it is possible to reduce the total area for reference resistance elements. In this regard, in order to share the reference resistance element RC, the resistance value of the reference resistance element RC in accordance with the implementation of the present disclosure is set differently from the conventional art. The resistance value of a reference resistance element which is connected to a comparison unit in the conventional art may correspond to the second reference resistance value RREF, and the resistance value of the reference resistance element RC of the memory circuit in accordance with the implementation of the present disclosure may be the first reference resistance value that is a half of the second reference resistance value RREF as described above. However, operations of the comparison unit according to the conventional art and the respective comparison units 410 and 420 according to the implementation of the present disclosure may be the same. Hereinbelow, a principle of why the operations of the respective comparison units 410 and 420 are the same as the conventional art even though the first resistance value of the reference resistance element RC is different from the resistance value of a reference resistance element which is connected to a comparison unit in the conventional art will be described with reference to FIG. 5.

Figure 5:
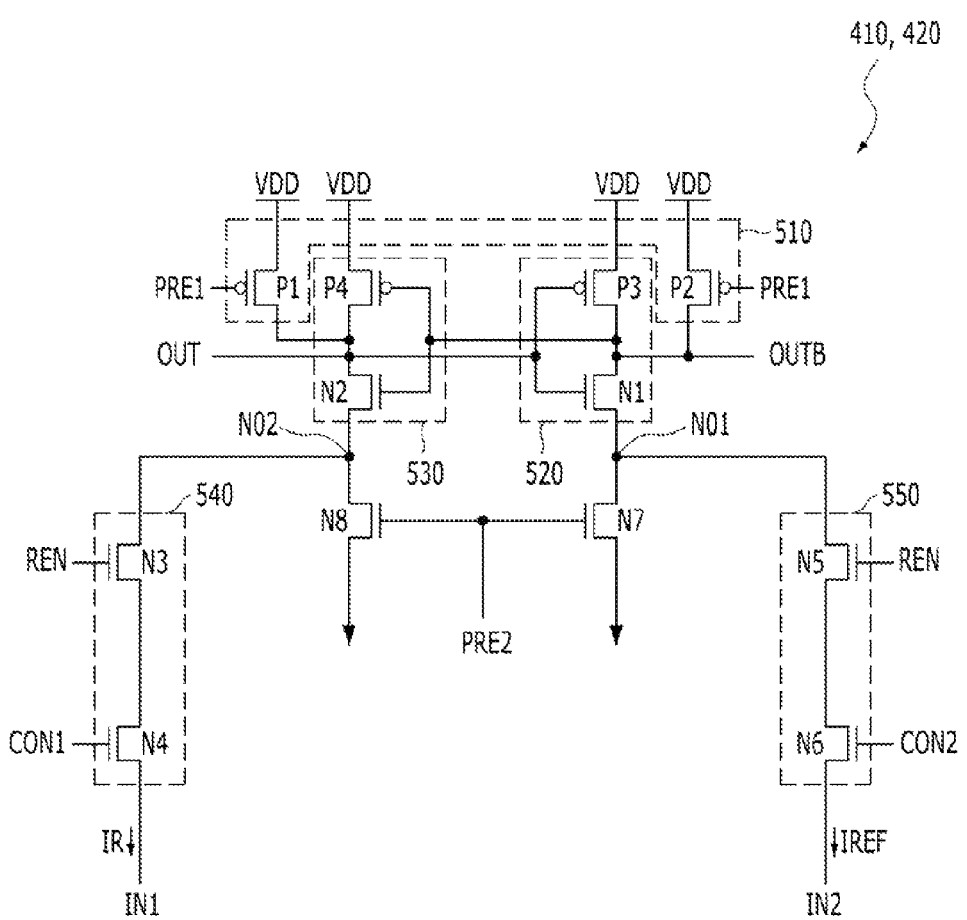
FIG. 5 shows an exemplary configuration diagram of the comparison units of FIG. 4.

FIG. 5 shows an exemplary configuration diagram of the comparison units 410 and 420 of FIG. 4.

As shown in FIG. 5, each of the comparison units 410 and 420 may include an output node OUT and an output bar node OUTB, a first internal node NO1 and a second internal node NO2, a precharge driving section 510 for pull-up driving the output node OUT and the output bar node OUTB during a precharge operation, an output bar driving section 520 for pull-up driving the output bar node OUTB or for driving the output bar node OUTB with the voltage of the first internal node NO1 in response to the voltage of the output node OUT during the read operation, an output driving section 530 for pull-up driving the output node OUT or for driving the output node OUT with the voltage of the second internal node NO2 in response to the voltage of the output bar node OUTB during the read operation, a first current sinking section 540 for drawing from the second internal node NO2 the read current IR1 or IR2 flowing through the first input terminal IN1 during the read operation, and a second current sinking section 550 for drawing from the first internal node NO1 to the reference current IREF1 or IRFE2 flowing through the second input node IN2 during the read operation.

Operations of each of the comparison units 410 and 420 will be described below with reference to FIG. 5.

The output node OUT corresponds to each of the output nodes OUT1 and OUT2 of the comparison units 410 and 420 in FIG. 4. Each of the comparison units 410 and 420 may output through the output node OUT a result of comparing the amounts of the read current IR1 or IR2 flowing through the first input node IN1 and the reference current IREF1 or IREF2 flowing through the second input node IN2.

The precharge driving section 510 may pull-up drive the output node OUT and the output bar node OUTB in response to a first precharge signal PRE1 which is activated during the precharge operation before the read operation. When the precharge operation is completed, the voltages of the output node OUT and the output bar node OUTB may be precharged to the same voltage level. The precharge driving section 510 may include a PMOS transistor P1 having the source to which a power supply voltage VDD is applied, the drain which is connected to the output node OUT and the gate to which the first precharge signal PRE1 is applied, and a PMOS transistor P2 having the source to which the power supply voltage VDD is applied, the drain which is connected to the output bar node OUTB and the gate to which the first precharge signal PRE1 is applied.

The output bar driving section 520 may pull-up drive the output bar node OUTB in response to the voltage of the output node OUT or drive the output bar node OUTB with the voltage of the first internal node NO1 during the read operation. The output bar driving section 520 may strongly drive the output bar node OUTB with the voltage of the first internal node NO1 as the voltage of the output node OUT gradually reaches a voltage level corresponding to a high level, and may strongly pull-up drive the output bar node OUTB as the voltage of the output node OUT gradually reaches a voltage level corresponding to a low level. The output bar driving section 520 may include a PMOS transistor P3 having the source to which the power supply voltage VDD is applied, the drain which is connected to the output bar node OUTB and the gate which is connected to the output in node OUT, and an NMOS transistor N1 having the source which is connected to the first internal node N01, the drain which is connected to the output bar node OUTB and the gate which is connected to the output node OUT.

The output driving section 530 may pull-up drive the output node OUT in response to the voltage of the output bar node OUTB or drive the output node OUT with the voltage of the second internal node NO2 during the read operation. The output driving section 530 may strongly drive the output node OUT with the voltage of the second internal node NO2 as the voltage of the output bar node OUTB gradually reaches a voltage level corresponding to a high level, and may strongly pull-up drive the output node OUT as the voltage of the output bar node OUTB gradually reaches a voltage level corresponding to a low level. The output driving section 530 may include a PMOS transistor P4 having the source to which the power supply voltage VDD is applied, the drain which is connected to the output node OUT and the gate which is connected to the output bar node OUTB, and an NMOS transistor N2 having the source which is connected to the second internal node NO2, the drain which is connected to the output node OUT and the gate which is connected to the output bar node OUTB.

The first current sinking section 540 may draw from the second internal node NO2 the read current IR1 or 1R2 flowing through the first input node IN1 during the read operation. The voltage of the first input node IN1 when the selected first variable resistance element. R1 or the selected second variable resistance element R2 electrically connected to the first input node IN1 has the first resistance value RL may be lower than when the selected first variable resistance element R1 or the selected second variable resistance element R2 electrically connected to the first input node IN1 has the second resistance value RH. The amount of the read current IR1 or IR2 flowing through the first input node IN1 when the resistance value of the selected first variable resistance element R1 or the selected second variable resistance element R2 electrically connected to the first input node IN1 has the first resistance value RL may be greater than when the selected first variable resistance element R1 or the selected second variable resistance element. R2 electrically connected to the first input node IN1 has the second resistance value RH.

In detail, the first current sinking section 540 may include an NMOS transistor N3 having the drain which is connected to the second internal node NO2 and the gate to which a read enable signal REN is applied, and an NMOS transistor N4 having the gate to which a first control voltage CON1 is applied, and the source which is connected to the first input node IN1. The source of the NMOS transistor N3 and the drain of the NMOS transistor N4 may be connected with each other. The read enable signal REN may be activated, and the NMOS transistor N3 may be turned on during the read operation. The first control voltage CON1 may limit the read current IR1 or IR2 flowing through the first input node IN1 to a desired amount. When the voltage of the first input node IN1 rises, the amount of the read current IR1 or IR2 flowing through the first input node IN1 may decrease as the voltage difference between the gate and the source of the NMOS transistor N4 decreases, and when the voltage of the first input node IN1 falls, the amount of the read current IR1 or IR2 flowing through the first input node IN1 may increase as the voltage difference between the gate and the source of the NMOS transistor N4 increases.

The second current sinking section 550 may draw from the first internal node NO1 the reference current IREF1 or IREF2 flowing through the second input node IN2 during the read operation. The first resistance value of the reference resistance element RC electrically connected to the second input node IN2 may be constant, and therefore the amount of the reference current IREF1 or IREF2 flowing through the second input node IN2 during the read operation may also be constant. During the read operation, the amount of the reference current IREF1 or IREF2 flowing through the second input node IN2 may be smaller than the amount of the read current IR1 or IR2 flowing through the first input node IN1 when the selected first variable resistance element R1 or the selected second variable resistance element R2 electrically connected to the first input node IN1 has the first resistance value RL, and may be greater than the amount of the read current IR1 or 1R2 flowing through the first input node IN1 when the selected first variable resistance element R1 or the selected second variable resistance element R2 electrically connected to the first input node IN1 has the second resistance value RH.

In detail, the second current sinking section 550 may include an NMOS transistor N5 having the drain which is connected to the first internal node NO1 and the gate to which the read enable signal REN is applied, and an NMOS transistor N6 having the gate to which a second control voltage CON2 is applied and the source which is connected to the second input node IN2. The source of the NMOS transistor N5 and the drain of the NMOS transistor N6 may be connected with each other. The read enable signal REN may be activated, and the NMOS transistor N5 may be turned on during the read operation. The second control voltage CON2 may limit the reference current IREF1 or IREF2 flowing through the second input node IN2 to a desired amount. The reference current IREF1 or IREF2 corresponding to the voltage difference between the second control voltage CON2 and the voltage of the second input node IN2 flows through the second input node IN2.

Besides, each of the comparison units 410 and 420 may include NMOS transistors N7 and N8 which are respectively connected to the first internal node NO1 and the second internal node NO2. The NMOS transistors N7 and N8 may pull-down drive the first internal node NO1 and the second internal node NO2 in response to a second precharge signal PRE2 which is activated during the precharge operation. According to the voltage levels and the durations of the activation periods of the first precharge signal PRE1 and the second precharge signal PRE2, the voltage level of a signal to be outputted through the output node OUT may be controlled.

The comparison units of the conventional art which do not share a reference resistance element and two comparison units of the implementation of the present disclosure which share a reference resistance element will be compared with reference to FIGS. 3 to 5. According to the conventional art, the resistance value of the reference resistance element is RREF and the amount of current flowing through the reference resistance element is IREF, and thus, the voltage of the second input node IN2 of each comparison unit is expressed as VIN2=RREF×IREF. According to the implementation of the present disclosure, the first resistance value of the a reference resistance element RC, which corresponds to the reference resistance element of the conventional art, is RREF/2, the amount of reference current IREF1 or IREF2 flowing through the second input node IN2 of each of the two comparison units is IREF and the amount of the reference current flowing through the reference resistance element RC is 2×IREF, and thus, the voltage of the second input node IN2 of each of the two comparison units is expressed as VIN2=(RREF/2)×(2×IREF)=RREF×IREF.

That is to say, the voltage VIN2 applied to the second input node IN2 of the conventional art and the implementation of the present disclosure is the same as each other. Because the amount of current flowing through the second input node IN2 of a comparison unit depends on the voltage of the second input node IN2 of the comparison unit, the amount of current flowing through the second input node IN2 of the conventional art and the implementation of the present disclosure is the same as each other. In other words, the comparison units of the conventional art and the implementation of the present disclosure operate in the same manner. Accordingly, two comparison units may share and use the reference resistance element. When the number of comparison units which share a reference resistance element is N, the first resistance value of the reference resistance element may be RREF/N, and operations of the respective comparison units are the same as the comparison units of the conventional art.

FIG. 6 shows an exemplary configuration diagram of a memory circuit (device) including variable resistance elements.

As shown in FIG. 6, a memory circuit (device) may include a plurality of first to $N^{th}$ variable resistance elements R1 to RN each having different resistance values according to the values stored therein, a first: reference resistance element RC having a first reference resistance value, and first to $N^{th}$ comparison units 610_1 to 610_N having first input nodes IN1 which are respectively connected to corresponding variable resistance elements selected among the plurality of first to $N^{th}$ variable resistance elements R1 to RN and second input nodes IN2 which are connected to the reference resistance element RC, and configured to determine whether the resistance values of the variable resistance elements connected to the first input nodes IN1 are greater or smaller than a second reference resistance value RREF.

The memory circuit (device) may further include select transistors ST which are connected with the variable resistance elements R1 to RN to allow current to flow through the variable resistance elements R1 to RN when the resistance values of the variable resistance elements R1 to RN changes. Each of the select transistors ST may be turned on when a word line connected thereto is activated, and turned off when the word line connected thereto is deactivated. Hereinafter, a $K^{th}$ (1≤K≤N) variable resistance element RK and a corresponding select transistor ST will be collectively referred to as a $K^{th}$ storage cell SCK. A $K^{th}$ comparison unit 610_K selected among the first to $N^{th}$ comparison units 610_1 to 610_N may be coupled to a $K^{th}$ group of storage cells SCK.

The memory circuit (device) will be described in detail with reference to FIG. 6.

The memory circuit of FIG. 6 may be the same as the memory circuit described with reference to FIG. 4 except that the number of comparison units of FIG. 6 is generally expressed. Also, the first to $N^{th}$ comparison units 610_1 to 610_N of FIG. 6 may be the same as described above with reference to FIG. 5. The differences between the memory circuit of FIG. 6 and the memory circuit of FIG. 4 will be described below while concentrating on operations.

The first to $N^{th}$ groups of storage cells SC1, to SCN may correspond to the first to $N^{th}$ comparison units 610_1 to 610_N, respectively. The $K^{th}$ (1≤K≤N) comparison unit may determine whether the resistance value of a $K^{th}$ variable resistance element. RK included in the $K^{th}$ storage cell SCK selected among the $K^{th}$ group of storage cells SCK is greater or smaller than the second reference resistance value RREF by comparing the amount of the read current IRK and the amount of the reference current IREFK, and may output the result of determination or comparison through an output node OUTK. The $K^{th}$ storage cell SCK may be selected among the $K^{th}$ group of storage cells SCK is the same as described above with reference to FIG. 4.

In a read operation, each of the First to $N^{th}$ storage cells SC1 to SCN may be simultaneously selected from each of the first to $N^{th}$ group of storage cells SC1 to SCN, and the values stored in the selected first to $N^{th}$ storage cells SC1 to SCN may be simultaneously read. The read operations of the respective comparison units are the same as described above with reference to FIGS. 4 and 5. The amounts of the read current IR1 to IRN flowing through the first input nodes IN1 of the first to $N^{th}$ comparison units 610_4 to 610_N may depend on the values stored in the variable resistance elements R1 to RN included in the selected first to $N^{th}$ storage cells SC1 to SCN. The amounts of the reference current IREF1 to IREFN flowing through the second input nodes IN2 of the first to $N^{th}$ comparison units 610_1 to 610_N may be constant as IREF as described above with reference to FIGS. 4 and 5.

Accordingly, during the read operation, the amounts of the reference current IREF1 to IREFN flowing through the second input nodes IN2 of the first to $N^{th}$ comparison units 610_1 to 610_N may be the same as IREF, and the total amount of the reference current flowing through the reference resistance element RC becomes N×IREF as the sum of the amounts of current IREF1 to IREFN flowing through the second input nodes IN2 of the first to $N^{th}$ comparison units 610_1 to 610_N. In the memory circuit of FIG. 6, the first reference resistance value of the reference resistance element RC may be 1/N of the second reference resistance value RREF (RL<RREF<RH) and therefore the first reference resistance value may be RREF/N. Accordingly, the voltage VIN2 of the second input nodes IN2 of the first to $N^{th}$ comparison units 610_1 to 610_N may be expressed as VIN2=(N×IREF)× (RREF/N) IREF×RREF. As a consequence, each one of N comparison units according to the implementation of the present disclosure may operate in the same manner as the conventional art.

The effects of the memory circuit shown in FIG. 6 may be the same as the effects of the memory circuit of FIG. 4. As the number of comparison units which share reference resistance elements increases, the effect of reducing the area of the memory circuit may become greater.

For reference, while it is illustrated in FIG. 6 that the storage cells SC1 to SCN corresponding to the first to $N^{th}$ comparison units 610_1 to 610_N are connected to the same word lines, it is to be noted that variable resistance elements corresponding to respective comparison units may be connected to different word lines according to design.

The above and other memory circuits or semiconductor devices based on the disclosed technology can be used in a range of devices or systems. FIGS. 7-11 provide some examples of devices or systems that can implement the memory circuits disclosed herein.

Figure 7:
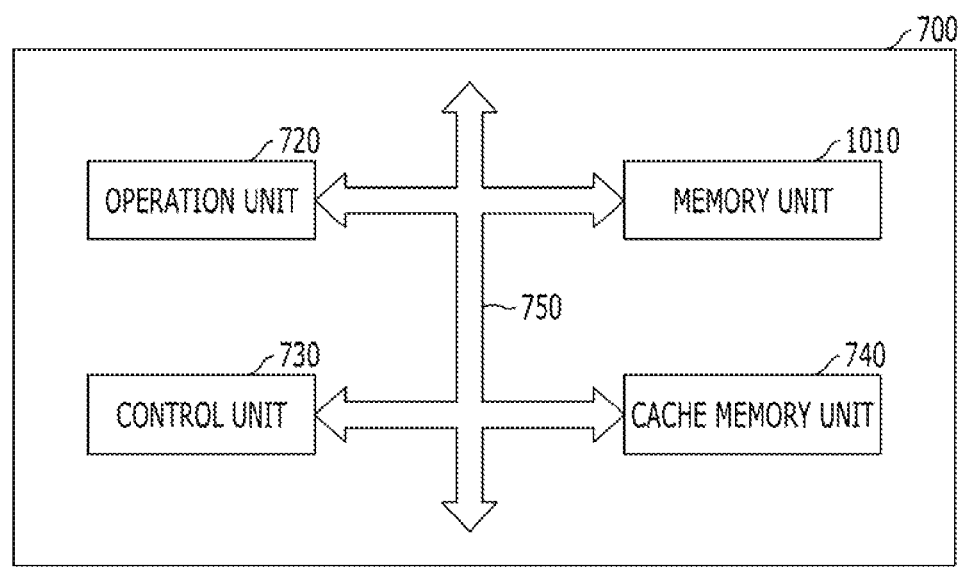
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. A memory unit may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this, a size of the memory unit 1010 may be reduced. Consequently, a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
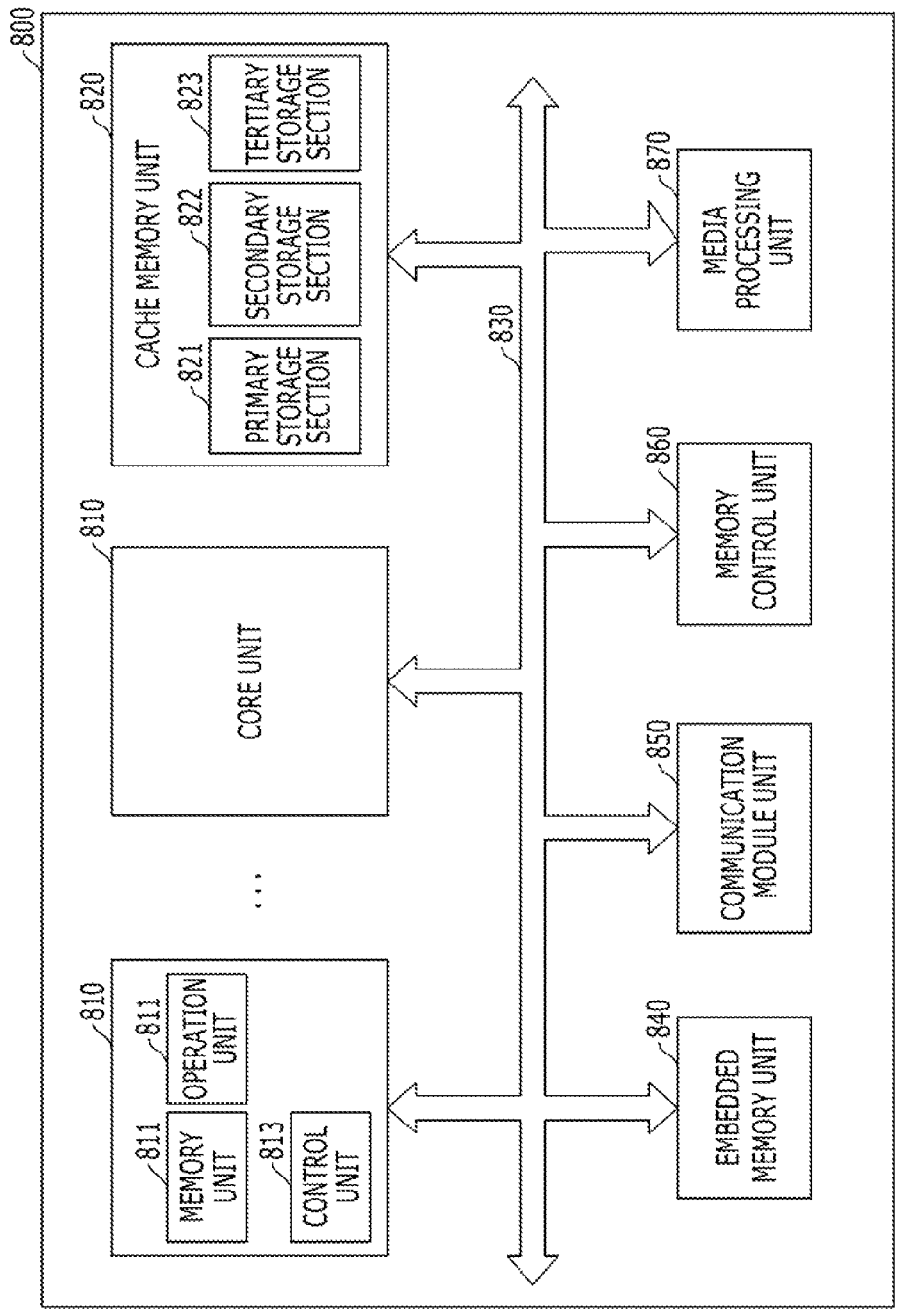
FIG. 8 shows an example of a configuration diagram of a processor implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this, a size of the cache memory unit 1120 may be reduced. Consequently, a size of the processor 1100 may be reduced.

Although it was shown in FIG. 8 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (0) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high d ion multimedia interface (HDMI) controller, and so on.

Figure 9:
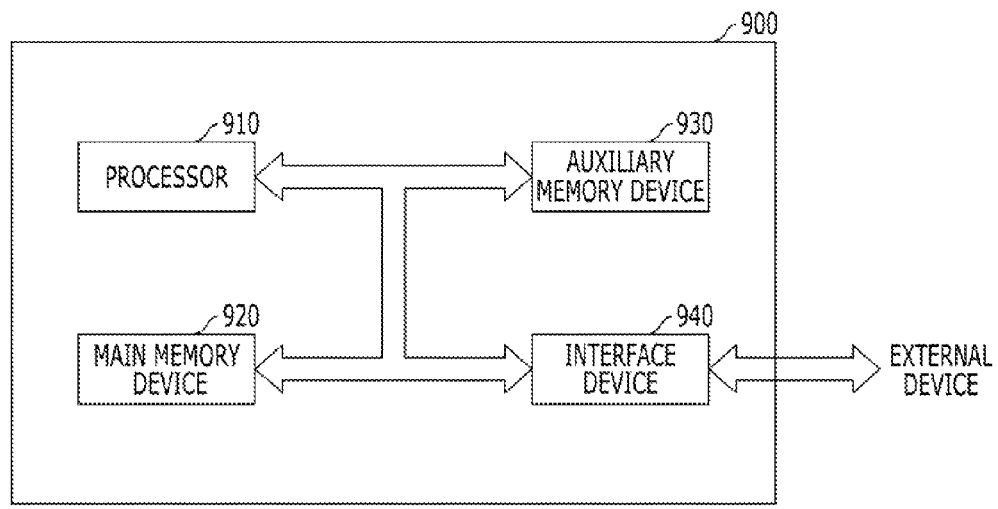
FIG. 9 shows an example of a configuration diagram of a system implementing memory circuitry based on the disclosed technology.

FIG. 9 is a configuration diagram of a system based on another implementation of the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc, for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off.

The main memory device 1220 may include one or more of the above-described semiconductor devices in accordance with the implementations. For example, the main memory device 1220 implementation may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this a size of the main memory device 1220 may be reduced. Consequently, a size of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this a size of the auxiliary memory device 1230 may be reduced. Consequently, a size of the system 1200 may be reduced.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC) a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
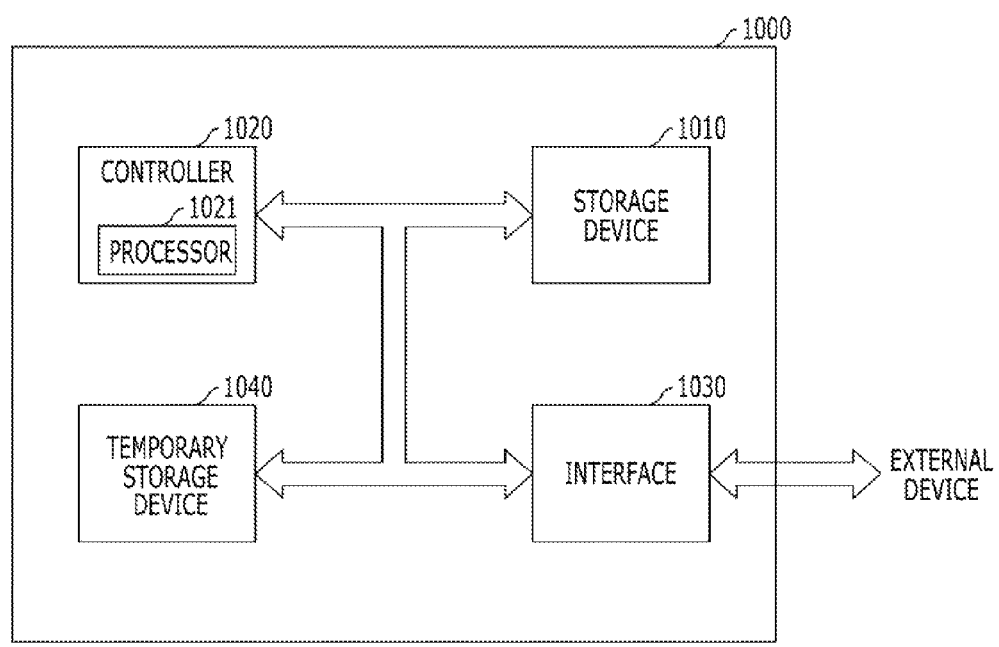
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory) a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this, a size of the temporary storage device 1340 may be reduced. Consequently, a size of the data storage system 1300 may be reduced.

Figure 11:
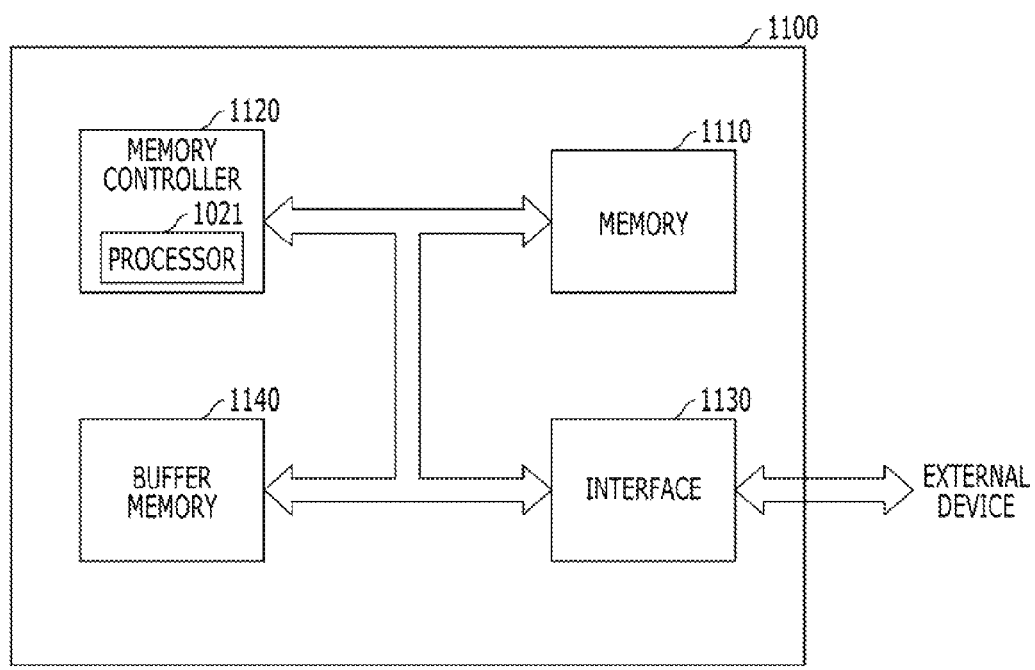
FIG. 11 shows an example of a configuration diagram of a memory system implementing memory circuitry based on the disclosed technology.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this, a size of the memory 1410 may be reduced. Consequently, a size of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include first to $N^{th}$ variable resistance elements each having different resistance values according to values stored therein, wherein N is a natural number equal to or greater than 2; a reference resistance element having a first reference resistance value; and first to $N^{th}$ comparison units which correspond to the first to $N^{th}$ variable resistance elements, respectively, and each of which determines whether a resistance value of the corresponding variable resistance element is greater or less than a second reference resistance value, wherein the first to $N^{th}$ comparison units are commonly coupled to the reference resistance element. Through this, a size of the buffer memory 1440 may be reduced Consequently, a size of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit, the semiconductor memory unit comprising: first to $N^{th}$ variable resistance elements each having different resistance values according to values stored therein, wherein N is a natural number equal to or greater than 2;
a reference resistance element having a first reference resistance value; and
first to $N^{th}$ comparison units which correspond to the first to $N^{th}$ in variable resistance elements, respectively, and each of which determines whether a resistance value of the corresponding variable resistance element is greater or less than a second reference resistance value, wherein the first to $N^{th}$ comparison units are commonly coupled to the reference resistance element.

2. The electronic device according to claim 1, wherein the first reference resistance value is 1/N of the second reference resistance value.

3. The electronic device according to claim herein each of the first to $N^{th}$ variable resistance elements has a first resistance value smaller than the second reference resistance value when a first value is stored therein, and has a second resistance value greater than the second reference resistance value when a second value is stored therein.

4. The electronic device according to claim 3, wherein a $K^{th}$ ($1 \leq K \leq N$) comparison unit among the first to $N^{th}$ comparison units outputs a result of the determination by comparing an amount of a $K^{th}$ variable current flowing through a $K^{th}$ variable resistance element corresponding to the $K^{th}$ comparison unit and an amount of a $K^{th}$ reference current flowing between the $K^{th}$ comparison unit and the reference resistance element.

5. The electronic device according to claim 4,
wherein a value stored in the $K^{th}$ variable resistance element is the first value when the amount of the $K^{th}$ variable current is greater than the $K^{th}$ reference current, and
wherein a value stored in the $K^{th}$ variable resistance element is the second value when the amount of the $K^{th}$ variable current is smaller than the $K^{th}$ reference current.

6. The electronic device according to claim 5, wherein an amount of current flowing through the reference resistance element is a sum of the amounts of first to $N^{th}$ reference currents flowing between the first to $N^{th}$ comparison units and the reference resistance element, respectively.

7. The electronic device according to claim 6, wherein each of the $K^{th}$ comparison unit comprises:
an output node and an output bar node;
a first internal node and a second internal node;
a precharge driving section suitable for pull-up driving the output node and the output bar node during a precharge operation;
an output bar driving section suitable for driving the output bar node with one of a pull-up voltage or a voltage of the first internal node in response to a voltage of the output node during a read operation;
an output driving section suitable for driving the output node with one of the pull-up voltage and a voltage of the second internal node in response to a voltage of the output bar node during the read operation;
a first current sinking section suitable for drawing the $K^{th}$ variable current from the first internal node during the read operation; and
a second current sinking section suitable for drawing the $K^{th}$ reference current from the second internal node during the read operation.

8. The electronic device according to claim 7,
wherein the output bar driving section pull-down drives the output bar node, and the output driving section pull-up drives the output node when the amount of the $K^{th}$ variable current is greater than the $K^{th}$ reference current, and wherein the output bar driving section pull-up drives the output bar node, and the output driving section pull-down drives the output node when the amount of the $K^{th}$ variable current is smaller than the $K^{th}$ reference current.

9. The electronic device according to claim 1, wherein each of the first to $N^{th}$ variable resistance elements comprises at least one of a metal oxide, a phase change substance, and a structure in which a tunnel barrier layer is interposed between two ferromagnetic layers.

10. The electronic device according to claim further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the variable resistance element is part of the cache memory unit in the processor.

11. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit that includes the variable resistance element is part of the storage device or the temporary storage device in the data storage system.

12. An electronic device comprising a semiconductor memory unit, the semiconductor memory unit comprising:
   first to $N^{th}$ groups of variable resistance elements each variable resistance element of which has different resistance values according to values stored therein, wherein N is a natural number equal to or greater than 2;
   a reference resistance element having a first reference resistance value; and
   first to $N^{th}$ comparison units which correspond to the first to $N^{th}$ groups of variable resistance elements, respectively, and each of which determines whether a resistance value of one selected among the corresponding group of variable resistance elements is greater or alter than a second reference resistance value
   wherein the first to $N^{th}$ comparison units are commonly coupled to the reference resistance element.

13. The electronic device according to claim 12, wherein the first reference resistance value is 1/N of the second reference resistance value.

14. The electronic device according to claim 2, wherein each variable resistance element of the first to $N^{th}$ groups of variable resistance elements has a first resistance value smaller than the second reference resistance value when a first value is stored therein, and has a second resistance value greater than the second reference resistance value when a second value is stored therein.

15. The electronic device according to claim 12, wherein a $K^{th}$ ($1 \leq K \leq N$) comparison unit: among the first to $N^{th}$ comparison units outputs a result of the determination by comparing an amount of a $K^{th}$ variable current flowing through one selected from a $K^{th}$ group of variable resistance elements corresponding to the $K^{th}$ comparison unit and an amount of a $K^{th}$ reference current flowing between the $K^{th}$ comparison unit and the reference resistance element.

16. The electronic device according to claim 15,
   wherein a value stored in the one selected from the $K^{th}$ group of variable resistance elements is the first value when the amount of the $K^{th}$ variable current is greater than the $K^{th}$ reference current, and
   wherein the value stored the one selected from the $K^{th}$ group of variable resistance elements is the second value when the amount of the $K^{th}$ variable current is smaller than the $K^{th}$ reference current.

17. The electronic device according to claim 16, wherein an amount of current flowing through the reference resistance element is a sum of the amounts of first to $N^{th}$ reference currents flowing between the first to $N^{th}$ comparison units and the reference resistance element, respectively.

18. The electronic device according to claim 17, wherein each of the $K^{th}$ comparison unit comprises:
   an output node and an output bar node;
   a first internal node and a second internal node;
   a precharge driving section suitable for pull-up driving the output node and the output bar node during a precharge operation;
   an output bar driving section suitable for driving the output bar node with one of a pull-up voltage or a voltage of the first internal node in response to a voltage of the output node during a read operation;
   an output driving section suitable for driving the output node with one of the pull-up voltage and a voltage of the second internal node in response to a voltage of the output bar node during the read operation;
   a first current sinking section suitable for drawing the $K^{th}$ variable current from the first internal node during the read operation; and
   a second current sinking section suitable for drawing the $K^{th}$ reference current from the second internal node during the read operation.

19. The electronic device according to claim 18,
   wherein the output bar driving section pull-down drives the output bar node, and the output driving section pull-up drives the output node when the amount of the $K^{th}$ variable current is greater than the $K^{th}$ reference current, and
   wherein the output bar driving section pull-up drives the output bar node, and the output driving section pull-down drives the output node when the amount of the $K^{th}$ variable current is smaller than the $K^{th}$ reference current.

20. The electronic device according to claim 12, wherein each of the plurality of first to $N^{th}$ variable resistance elements comprises at least one of a metal oxide, a phase change substance, and a structure in which a tunnel barrier layer is interposed between two ferromagnetic layers.

* * * * *